United States Patent
Chung

(10) Patent No.: US 6,825,735 B2
(45) Date of Patent: Nov. 30, 2004

(54) POWER SUPPLY VOLTAGE AND TEMPERATURE-INDEPENDENT RC OSCILLATOR USING CONTROLLABLE SCHMITT TRIGGER

(75) Inventor: Kyu-young Chung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/396,774

(22) Filed: Mar. 25, 2003

(65) Prior Publication Data

US 2004/0036545 A1 Feb. 26, 2004

(30) Foreign Application Priority Data

Aug. 20, 2002 (KR) ........................................ 2002-49294

(51) Int. Cl.[7] .............................................. H03B 5/20
(52) U.S. Cl. ........................................ 331/135; 331/57
(58) Field of Search .................. 331/135, 57; 327/143, 327/198

(56) References Cited

U.S. PATENT DOCUMENTS 3,878,484 A * 4/1975 Hekimian ................... 331/143
5,739,708 A * 4/1998 LeWalter .................... 327/143
6,388,479 B1 * 5/2002 Gupta et al. ................ 327/143

* cited by examiner

Primary Examiner—Benny Lee
Assistant Examiner—Joseph Chang
(74) Attorney, Agent, or Firm—F. Chau & Associates LLC

(57) ABSTRACT

A power supply voltage-independent and temperature-independent RC oscillator using a controllable Schmitt trigger comprises a transition voltage generator circuit, a Schmitt trigger circuit, an RC delay circuit, and a quantizer. The transition voltage generator circuit generates a high transition voltage and a low transition voltage. The high and low transition voltages are proportional to a power supply voltage. The Schmitt trigger circuit generates an output voltage having a first level when an input voltage becomes greater than the high transition voltage and having a second level when the input voltage becomes less than the low transition voltage. The RC delay circuit comprises a resistor and a capacitor and generates the input voltage in response to the output voltage. The quantizer quantizes the input voltage to output a square-wave oscillation signal. Accordingly, an oscillation signal having a stable oscillation frequency unaffected by the external conditions can be obtained.

18 Claims, 9 Drawing Sheets

POWER SUPPLY VOLTAGE AND TEMPERATURE-INDEPENDENT RC OSCILLATOR USING CONTROLLABLE SCHMITT TRIGGER

CROSS-REFERENCE TO RELATED APPLICATIONS

This application claims the priority of Korean Patent Application No. 2002-49294, filed Aug. 20, 2002, which is incorporated herein in its entirety by reference.

BACKGROUND OF THE INVENTION

1. Field of the Invention

The present invention relates to an oscillator generating an oscillation signal, and more particularly, to an RC oscillator using a Schmitt trigger circuit.

2. Description of the Related Art

An oscillator is an electronic circuit that generates an oscillation signal having a constant oscillation frequency. It is essential for an oscillator to have a reliable oscillation frequency. That is, the oscillator must maintain a constant oscillation frequency regardless of external conditions such as temperature and power supply voltage. One problem with conventional oscillators is that they are not independent of external conditions.

FIGS. 1 through 4 are circuit diagrams of conventional oscillators. FIG. 1 shows a ring oscillator with a structure in which a plurality of inverters 110 (three inverters 110 in FIG. 1) are connected in series. A ring oscillator has a simple structure, but the transconductance value of a delay device, i.e., an inverter 110, can vary with temperature or power supply voltage, wherein an oscillation frequency also varies.

An oscillator shown in FIG. 2 includes a delay cell controlled by a bias current. Such an oscillator can be referred to as a current-starved delay oscillator. In the oscillator shown in FIG. 2, a bias current unit 220 controls the current flowing in three delay cells 210 implemented as inverters. A delay time of each delay cell 210 is determined in accordance with the current flowing in the delay cell 210, thus if the current is constant, an oscillation frequency is also kept constant. However, this oscillator has a problem in that its oscillation frequency changes when the current changes due to a change in a power supply voltage VDD.

FIG. 3 shows a conventional Schmitt trigger oscillator. The oscillator shown in FIG. 3 alternately charges and discharges a capacitor CC by alternately turning on a first switch SW1 and a second switch SW2 according to the voltage level of a signal output from a Schmitt trigger 310. When a power supply voltage VDD changes, a charging speed and a discharging speed also change, thereby changing the oscillation frequency. In addition, when the transition voltages VIH and VIL of the Schmitt trigger 310 change due to, for example, temperature, the oscillation frequency also changes.

To suppress a problem of an oscillation frequency changing according to external conditions such as power supply voltage and temperature, RC oscillators, which are relatively unaffected to the external conditions, can be used.

An oscillator shown in FIG. 4 is a conventional RC oscillator, which includes an odd number (five) of inverters IV1 through IV5, a capacitor Cf, and a resistance device Rf. The oscillation frequency of the RC oscillator shown in FIG. 4 is mainly determined by the resistance value of the resistance device Rf and the capacitance of the capacitor Cf. Accordingly, if the resistance value and capacitance are unaffected by temperature and power supply voltage, the oscillation frequency of an oscillation signal CLK can be kept constant.

Since the resistance device Rf is typically connected to the outside by a user, the resistance value can be kept constant. The designed capacitance of the capacitor Cf may be affected by, for example, the manufacturing process. To compensate for a change in capacitance, a plurality of capacitors can be connected in parallel, and some capacitors are disconnected by cutting fuses when necessary during use. In other words, a plurality of capacitors are provided, and if the capacitance during use is greater than an initially designed capacitance, specified capacitors are disconnected by cutting their fuses. However, the control of capacitance using fuses only reduces capacitance by disconnecting some capacitors. Accordingly, the control method using fuses can increase an oscillation frequency but cannot decrease it.

In addition, the conventional RC oscillator has a problem of high-voltage stress applied to the inverter IV1 connected to a first node N1. This is because of an effect in which charges are pumped by the capacitor Cf since the first and second nodes N1 and N2 are connected through the capacitor Cf.

Referring to FIG. 5, which shows voltage waveforms in the RC oscillator shown in FIG. 4, high-voltage stress is applied to the inverter IV1 at time instants t1, t2, t3, and t4 when second and third node voltages V2 and V3 change. A high voltage, which is higher than a power supply voltage VDD by a predetermined reference voltage VTR, is applied at the time instances t1 and t3. If high-voltage stress is continuously applied to the inverter IV1, the life or reliability of the RC oscillator is decreased.

SUMMARY OF THE INVENTION

To solve the above-described problems, it is an object of the present invention to provide an oscillator that generates an oscillation signal having a constant oscillation frequency, which is independent of external conditions such as power supply voltage and temperature.

It is another object of the present invention to provide an RC oscillator in which an oscillation frequency can be controlled during and after manufacture and in which high-voltage stress is not applied, thereby increasing reliability.

To achieve the above objects of the present invention, in one aspect, an RC oscillator is provided comprising a transition voltage generator circuit, which generates a high transition voltage and a low transition voltage, the high and low transition voltages being proportional to power supply voltage. The RC oscillator further comprises a Schmitt trigger circuit, which generates an output voltage having a first level when an input voltage becomes greater than the high transition voltage and having a second level when the input voltage becomes less than the low transition voltage. The RC oscillator further comprises an RC delay circuit having a resistance and comprising a capacitor, the RC delay circuit generating the input voltage in response to the output voltage, and a quantizer, which quantizes the input voltage to output a square-wave oscillation signal.

Preferably, the transition voltage generator circuit divides the power supply voltage, thereby generating the high transition voltage and the low transition voltage, wherein the low transition voltage is lower than the high transition voltage.

Preferably, the Schmitt trigger circuit comprises a voltage comparator, which compares the input voltage with a transition voltage to generate the output voltage; and a controller, which provides one of the high and low transition voltages as the transition voltage in response to the output voltage.

Preferably, the RC delay circuit includes first and second resistors connected to an output node; a first transistor, which is formed between the power supply voltage and the first resistor, is gated in response to the output voltage; a second transistor, which is formed between the second resistance and a ground voltage, is gated in response to the output voltage; and a capacitor, which is formed between the output node and the ground voltage.

In another aspect, there is provided an RC oscillator comprising a Schmitt trigger circuit, which generates an output voltage having a first level when an input voltage becomes greater than a high transition voltage and having a second level when the input voltage becomes less than a low transition voltage. The RC oscillator further comprises an RC delay circuit, which generates the input voltage by charging or discharging at least one capacitor, which is formed between a predetermined output node and a ground voltage, in response to the output voltage, and a quantizer, which outputs an oscillation signal having a predetermined oscillation frequency in response to the input voltage. The levels of the respective high and low transition voltages are proportional to a power supply voltage.

Preferably, the RC oscillator also comprises a transition voltage generator circuit, which divides the power supply voltage, thereby generating the high transition voltage and the low transition voltage lower than the high transition voltage. Preferably, the transition voltage generator circuit comprises a plurality of resistance devices, which are connected in series between the power supply voltage and the ground voltage; and a fuse, which is connected to at least one among the plurality of resistance devices in parallel.

Preferably, the RC delay circuit comprises a first transistor, which is formed between the power supply voltage and a predetermined first node and is gated in response to the output voltage and a second transistor, which is formed between a predetermined second node and the ground voltage and is gated in response to the output voltage. The RC delay circuit further comprises the plurality of capacitors, which are formed between the output node and the ground voltage, a first external terminal for electrically connecting a predetermined first resistor between the first node and the output node, and a second external terminal for electrically connecting a predetermined second resistor between the second node and the output node.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
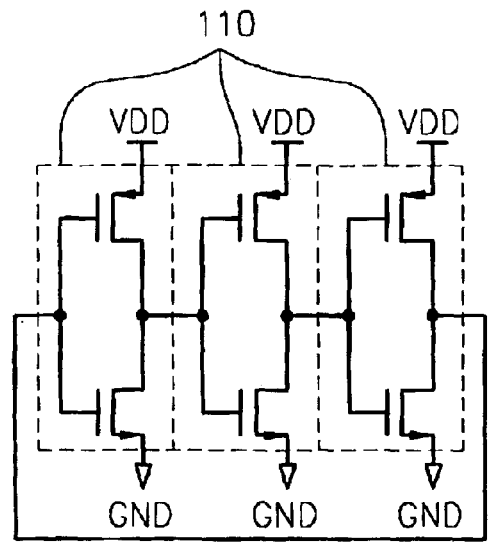
FIG. 1 is a circuit diagram of a conventional ring oscillator.
Figure 2:
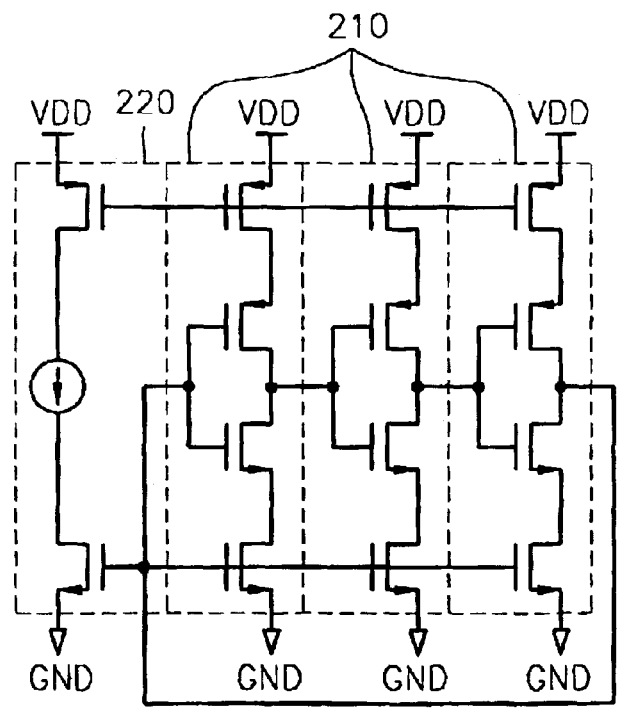
FIG. 2 is a circuit diagram of a conventional current-starved delay oscillator.
Figure 3:
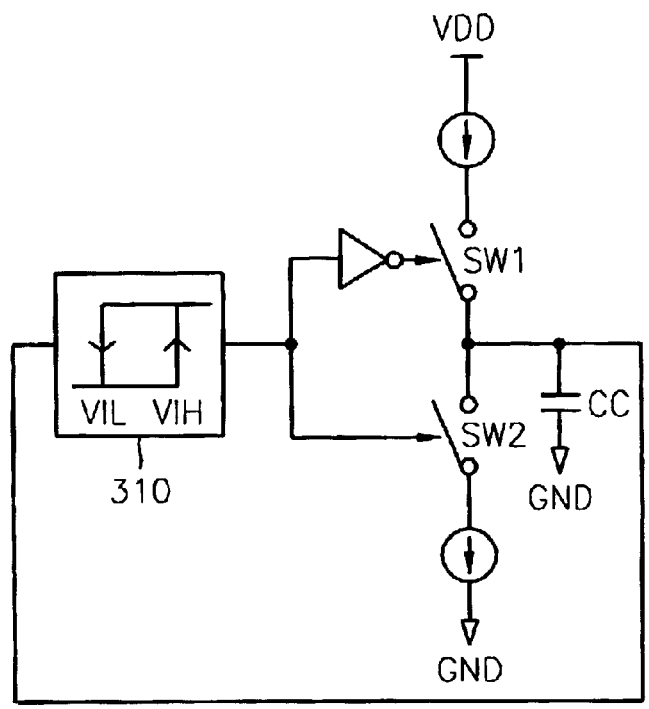
FIG. 3 is a circuit diagram of a conventional oscillator using a Schmitt trigger.
Figure 4:
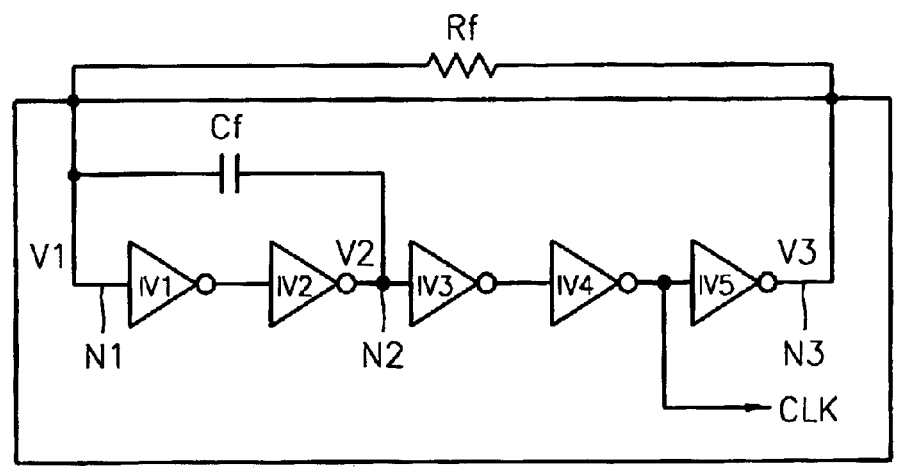
FIG. 4 is a circuit diagram of a conventional RC oscillator.
Figure 5:
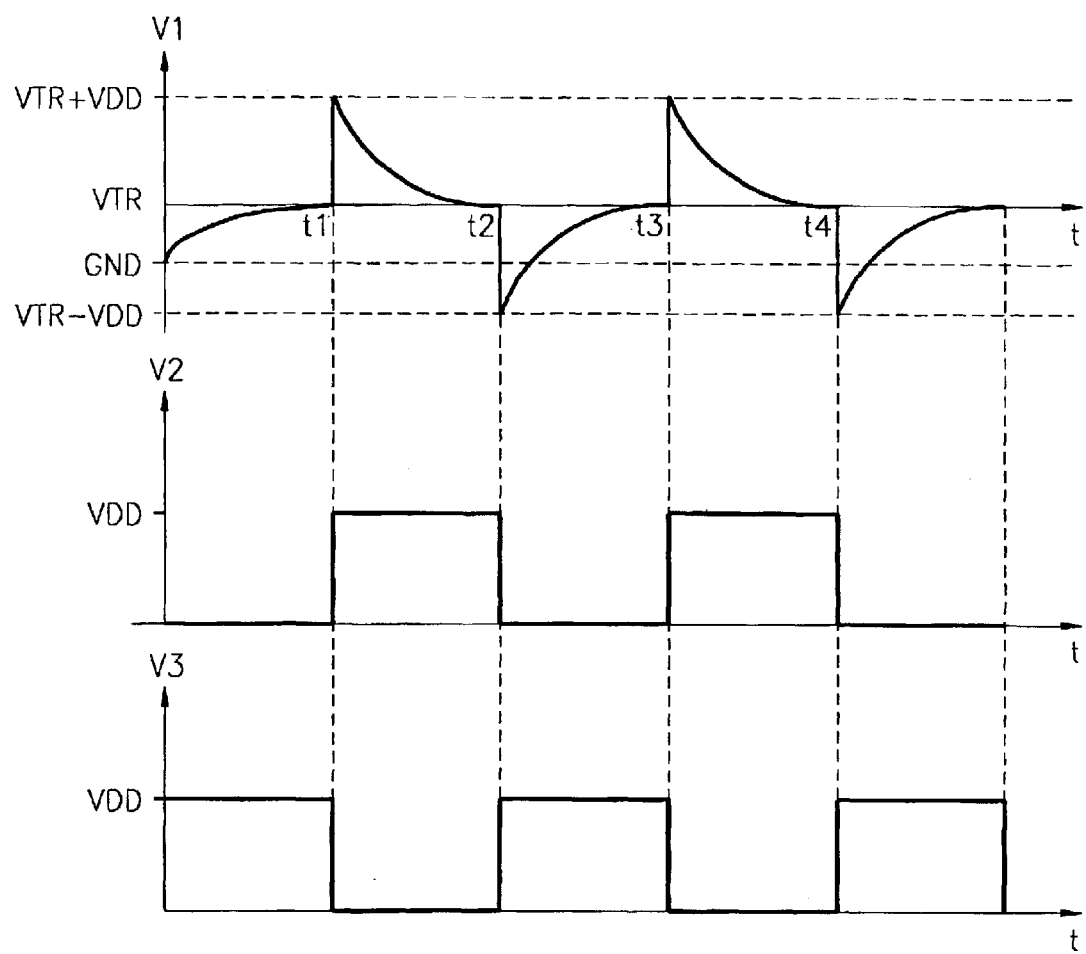
FIG. 5 is a diagram showing voltage waveforms in the RC oscillator shown in FIG.4.

Hereinafter, preferred embodiments of the present invention will be described in detail with reference to the attached drawings. In the drawings, the same reference numerals denote the same member.

Figure 6:
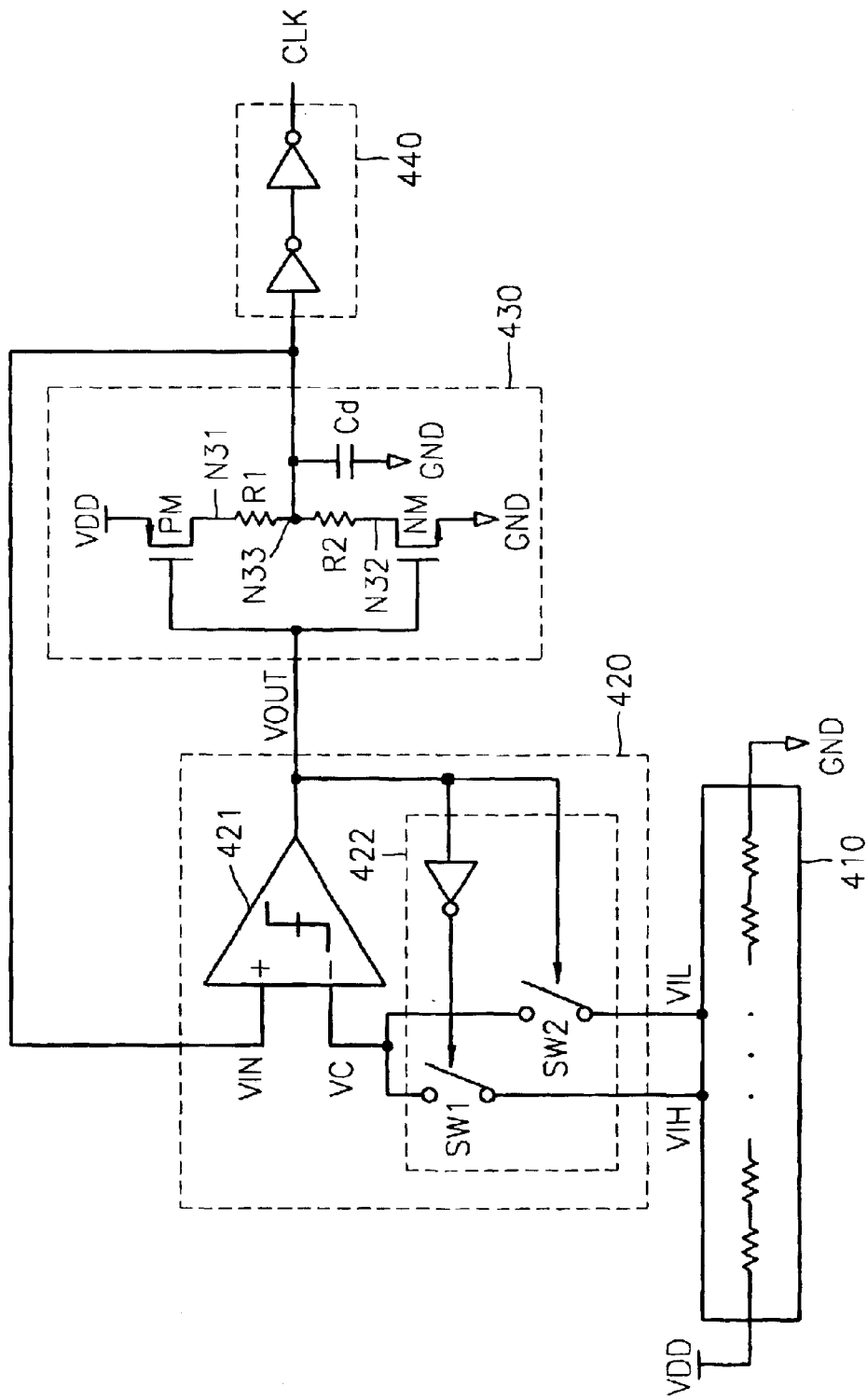
FIG. 6 is a circuit diagram of an oscillator according to a first embodiment of the present invention.

FIG. 6 is a circuit diagram of an oscillator according to a first embodiment of the present invention. Referring to FIG. 6, the oscillator comprises a transition voltage generator circuit 410, a Schmitt trigger circuit 420, an RC delay circuit 430, and a quantizer 440.

Figure 7:
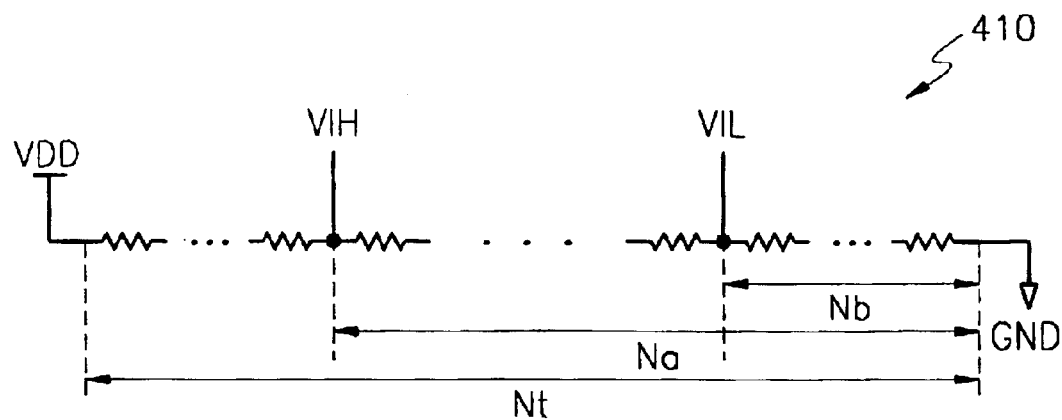
FIG. 7 is a detailed diagram of a transition voltage generator circuit shown in FIG. 6.

The transition voltage generator circuit 410 generates a high transition voltage VIH and a low transition voltage VIL using a power supply voltage VDD. Referring to FIG. 7, which shows the transition voltage generator circuit 410 in detail, the transition voltage generator circuit 410 is a voltage divider, which generates the high transition voltage VIH and the low transition voltage VIL by dividing the power supply voltage VDD. The transition voltage generator circuit 410 takes a voltage applied to Na resistance devices among Nt resistance devices, which are connected in series between the power supply voltage VDD and a ground voltage GND, as the high transition voltage VIH and takes a voltage applied to Nb resistance devices as the low transition voltage VIL. Here, Nt, Na, and Nb indicate the numbers of resistance devices, but they may indicate distances from the ground voltage GND if the resistance devices are realized as a single material in which a resistance value varies with a distance from the ground voltage GND.

The high transition voltage VIH, the low transition voltage VIL, and the power supply voltage VDD are related by Formula (1).

$$VIH = \frac{Na}{Nt} \times VDD, \; VIL = \frac{Nb}{Nt} \times VDD (Nt > Na > Nb) \qquad (1)$$

Accordingly, the high transition voltage VIH and the low transition voltage VIL are proportional to the power supply voltage VDD.

The Schmitt trigger circuit 420 generates an output voltage VOUT at a first level (a high level in the first embodiment) when an input voltage VIN is higher than or equal to the high transition voltage VIH and generates an output voltage VOUT at a second level (a low level in the first embodiment) when the input voltage VIN is lower than or equal to the low transition voltage VIL. Here, the high level indicates the level of the power supply voltage VDD.

The Schmitt trigger circuit 420 comprises a voltage comparator 421 and a controller 422. The voltage comparator 421 receives the input voltage VIN through a positive (+) terminal, receives a transition voltage VC through a negative (−) terminal, and compares the input voltage VIN with the transition voltage VC to generate the output voltage VOUT.

Figure 8:
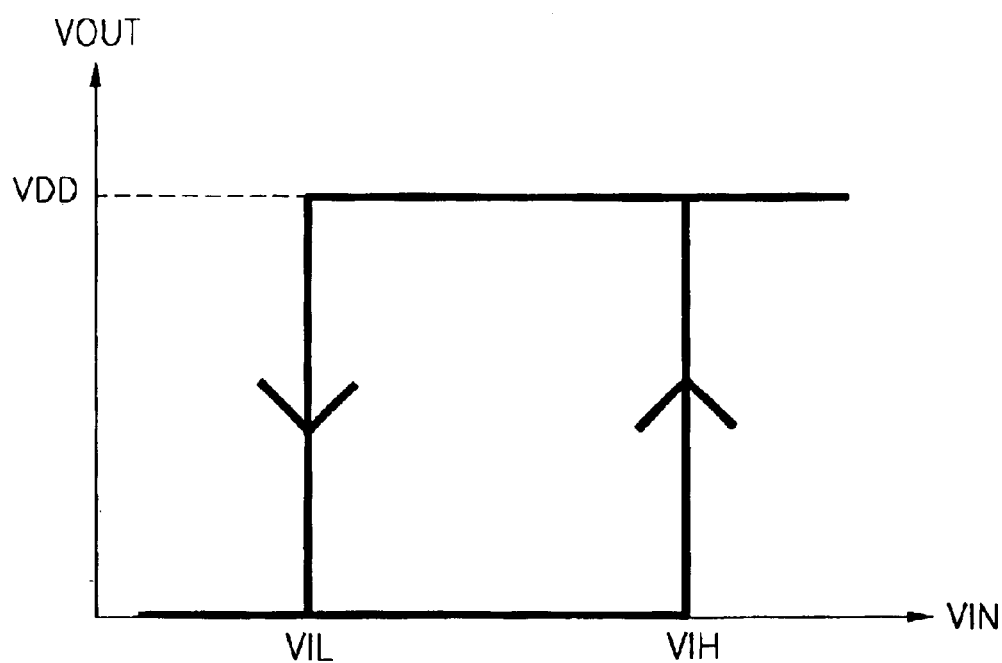
FIG. 8 is a diagram showing an input/output transfer characteristic of a Schmitt trigger circuit shown in FIG. 6.

The controller 422 provides either the high transition voltage VIH or the low transition voltage VIL as the transition voltage VC in response to the output voltage VOUT of the voltage comparator 421 and includes first and second control switches SW1 and SW2 and an inverter. The first control switch SW1 is disposed between the negative terminal of the voltage comparator 421 and the transition voltage generator circuit 410 and is turned on or off by an inverted voltage of the output voltage VOUT. The second control switch SW2 is also disposed between the negative terminal of the voltage comparator 421 and the transition voltage generator circuit 410 and is turned on or off by the output voltage VOUT. Accordingly, when the output voltage VOUT is at the low level, the second control switch SW2 is turned off while the first control switch SW1 is turned on, so the high transition voltage VIH is provided as the transition voltage VC. When the input voltage VIN becomes larger than the high transition voltage VIH, the output voltage VOUT increases to the high level. When the output voltage VOUT is at the high level, the first control switch SW1 is turned off while the second control switch SW2 is turned on, so the low transition voltage VIL is provided as the transition voltage VC. When the input voltage VIN becomes smaller than the low transition voltage VIL in a state where the low transition voltage VIL is provided as the transition voltage VC, the output voltage VOUT decreases to the low level. The above-described input/output transfer characteristic of the Schmitt trigger circuit 420 is shown in FIG. 8.

Referring again to FIG. 6, the RC delay circuit 430 comprises first and second transistors PM and NM, first and second resistors R1 and R2, and a capacitor Cd. The first transistor PM is preferably a PMOS transistor, which has a source connected to the power supply voltage VDD, a drain connected to a terminal N31 of the first resistor R1, and a gate receiving the output voltage VOUT. The second transistor NM is preferably an NMOS transistor, which has a source connected to the ground voltage, a drain connected to a terminal N32 of the second resistor R2, and a gate receiving the output voltage VOUT. Each of the first and second transistors PM and NM is a kind of switch, which is turned on or off in response to the output voltage VOUT.

The first resistor R1 is formed between the drain of the first transistor PM and an output node N33, the second resistor R2 is formed between the drain of the second transistor NM and the output node N33. It is preferable that the first and second resistors R1 and R2 have the same resistance value. The capacitor Cd is formed between the output node N33 and the ground voltage GND.

When the output voltage VOUT is at the low level, the first transistor PM is turned on while the second transistor NM is turned off, so the capacitor Cd is charged through the first resistor R1. Conversely, when the output voltage VOUT is at the high level, the first transistor PM is turned off while the second transistor NM is turned on, so the capacitor Cd is discharged through the second resistor R2.

Preferably, the turn-on resistances of the first and second transistors PM and NM are much smaller than the first and second resistors R1 and R2, respectively. In other words, it is preferable that the sizes of the first and second transistors PM and NM are sufficiently large so that the turn-on resistances of the respective first and second transistors PM and NM can be ignored compared to the first and second resistors R1 and R2. When the turn-on resistances of the first and second transistors PM and NM are sufficiently small, a delay time is determined in accordance with an RC time-constant only. Accordingly, a delay time from the receipt of the output voltage VOUT to the generation of the input voltage VIN by the RC delay circuit 430 is constant regardless of the conditions of temperature and power supply voltage VDD.

The quantizer 440 quantizes the input voltage VIN to output an oscillation signal and comprises at least one inverter. The quantizer, 440 outputs a high level (i.e., the voltage level of the power supply voltage VDD) when the input voltage VIN is higher than a reference voltage VTR (refer to FIG. 9) and outputs a low level when the input voltage VIN is lower than the reference voltage VTR. Accordingly, an oscillation signal CLK output from the quantizer 440 is a square wave.

Figure 9:
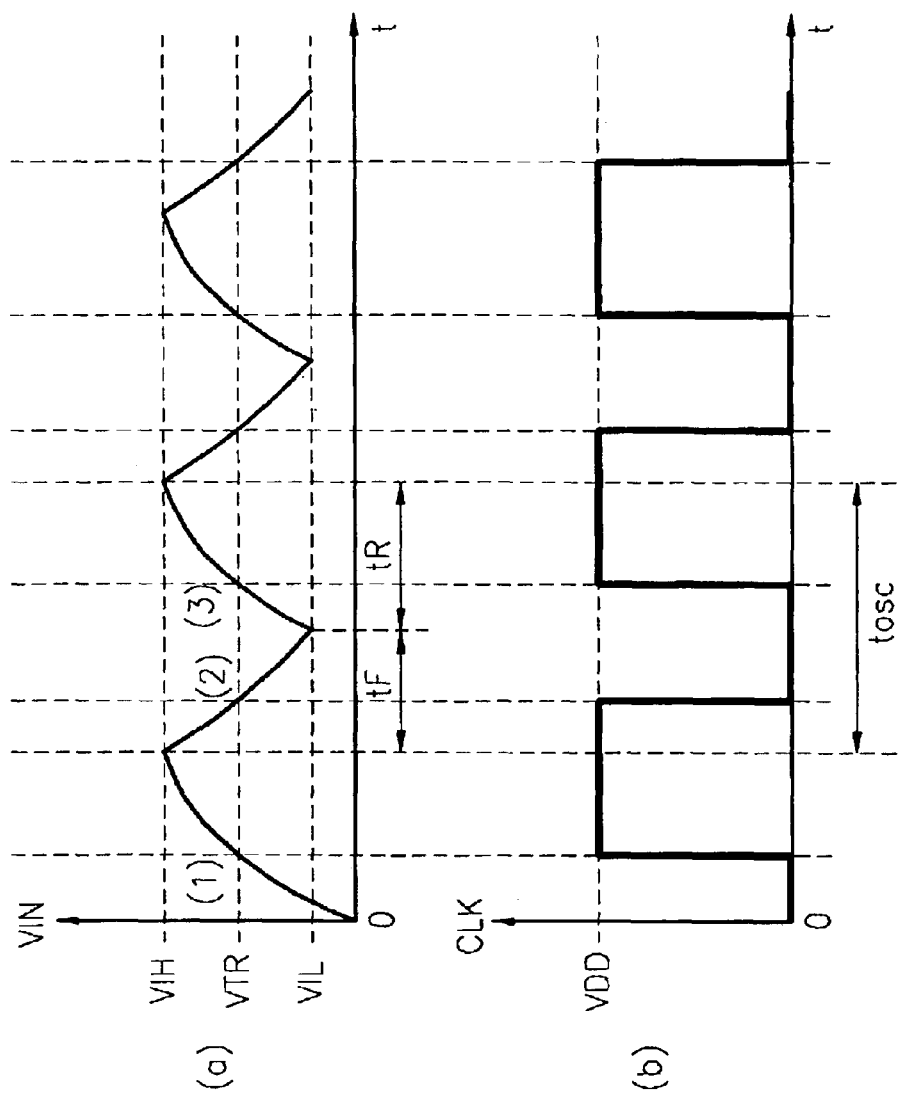
FIG. 9 is a diagram showing the waveforms of signals of the RC oscillator shown in FIG. 6.

FIG. 9 is a diagram showing waveforms of signals of the RC oscillator according to the first embodiment of the present invention. As shown in FIG. 9(a), the input voltage VIN output from the RC delay circuit 430 is a pyramidal wave. The oscillation signal CLK obtained by quantizing the input voltage VIN is a square wave, as shown in FIG. 9(b).

The operation of the RC oscillator according to the first embodiment of the present invention will be described with reference to FIGS. 6 and 9. When the output voltage VOUT and the input voltage VIN are at the low level (i.e., 0) at an initial stage, the first transistor PM of the RC delay circuit 430 is turned on, so the input voltage VIN increases as shown in the first section (1) of FIG. 9(a). When the input voltage VIN increases to the high transition voltage VIH, the output voltage VOUT is at the high level (i.e., the level of the power supply voltage VDD). Then, the second transistor NM of the RC delay circuit 430 is turned on, so the input voltage VIN decreases as shown in a second section (2) of FIG. 9(a). When the input voltage VIN decreases to the low transition voltage VIL, the output voltage VOUT is at the low level. When the output voltage VOUT is at the low level, the first transistor PM of the RC delay circuit 430 is turned on again, so the input voltage VIN increases as shown in a third section (3) of FIG. 9(a). Thereafter, the second and third sections (2) and (3) alternate with each other.

As the second and third sections (2) and (3) alternate with each other, an oscillation signal CLK having a pulse with a predetermined period is output from the quantizer 440, as shown in FIG. 9(b).

A period of time corresponding to the second section (2) of FIG. 9(a) is referred to as a falling time tF. The falling time tF is a period of time taken for the input voltage VIN, which is the voltage in an RC circuit, to decrease from the initial high transition voltage VIH to the low transition voltage VIL. The RC circuit comprises the second resistor R2, the turn-on resistance RONn of the second transistor NM, and the capacitor Cd. Since an initial value Va(0) is the high transition voltage VIH and a final value Va(∞) is 0, an input voltage Va(t) in the second section (2) is defined by Formula (2). Accordingly, the falling time tF is determined according to Formula (3) by applying t=tF and Va(t)=VIL to Formula (12).

$$Va(t) = VIH \times \exp\left(\frac{-t}{(Rd + RONn)Cd}\right) \quad (2)$$

Here, Rd indicates the resistance value of the second resistor R2, and Cd indicates the capacitance of the capacitor Cd.

$$tF = (Rd + RONn)Cd \times \ln\frac{VIH}{VIL} \text{ (sec)} \quad (3)$$

When the size of the second transistor NM is sufficiently large so that the turn-on resistance RONn of the second transistor NM can be ignored, and when VIH and VIL in Formula (1) are applied to Formula (3), the falling time tF can be simplified as Formula (4).

$$tF \cong Rd \times Cd \times \ln\frac{Na}{Nb} \text{ (sec)} \quad (4)$$

A period of time corresponding to the third section {3} of FIG. 9(a) is referred to as a rising time tR. The rising time tR is a period of time taken for the input voltage VIN to increase from the initial low transition voltage VIL, which is the voltage in an RC circuit, to the high transition voltage VIH. The RC circuit comprises the first resistor R1, the turn-on resistance RONp of the first transistor PM, and the capacitor Cd. Since an initial value Va(0) is the low transition voltage VIL and a final value Va(∞) is VDD, an input voltage Va(t) in the second section (2) is defined by Formula (5). Accordingly, the rising time tR is determined according to Formula (6) by applying t=tR and Va(t)=VIH to Formula (5).

$$Va(t) = VDD - (VDD - VIL) \times \exp\left(\frac{-t}{(Rd + RONp)Cd}\right) \quad (5)$$

$$tR = (Rd + RONp)Cd \times \ln\frac{VDD - VIL}{VDD - VIH} \text{ (sec)} \quad (6)$$

When the size of the first transistor PM is sufficiently large so that the turn-on resistance RONp of the first transistor PM can be ignored, and when VIH and VIL in Formula (1) are applied to Formula (6), the rising time tR can be simplified as Formula (7).

$$tR \cong Rd \times Cd \times \ln\frac{Nt - Nb}{Nt - Na} \text{ (sec)} \quad (7)$$

An oscillation period tOSC is tR+F, and an oscillation frequency fOSC is the reciprocal of the oscillation period tOSC, so the oscillation frequency fOSC is determined according to Formula (8).

$$fOSC = \frac{1}{tOSC} + \frac{1}{Rd \times Cd\left(\ln\frac{Na}{Nb} + \ln\frac{Nt - Nb}{Nt - Na}\right)} \quad (8)$$

Here, Rd and Cd are the resistance value and capacitance of the RC delay circuit 430 and are constants determined by a designer. Na, Nb, and Nt are constants determined in accordance with the transition voltage generator circuit 410. Thus, the oscillation frequency fOSC is determined regardless of the external conditions such as the power supply voltage VDD and temperature.

Figure 10:
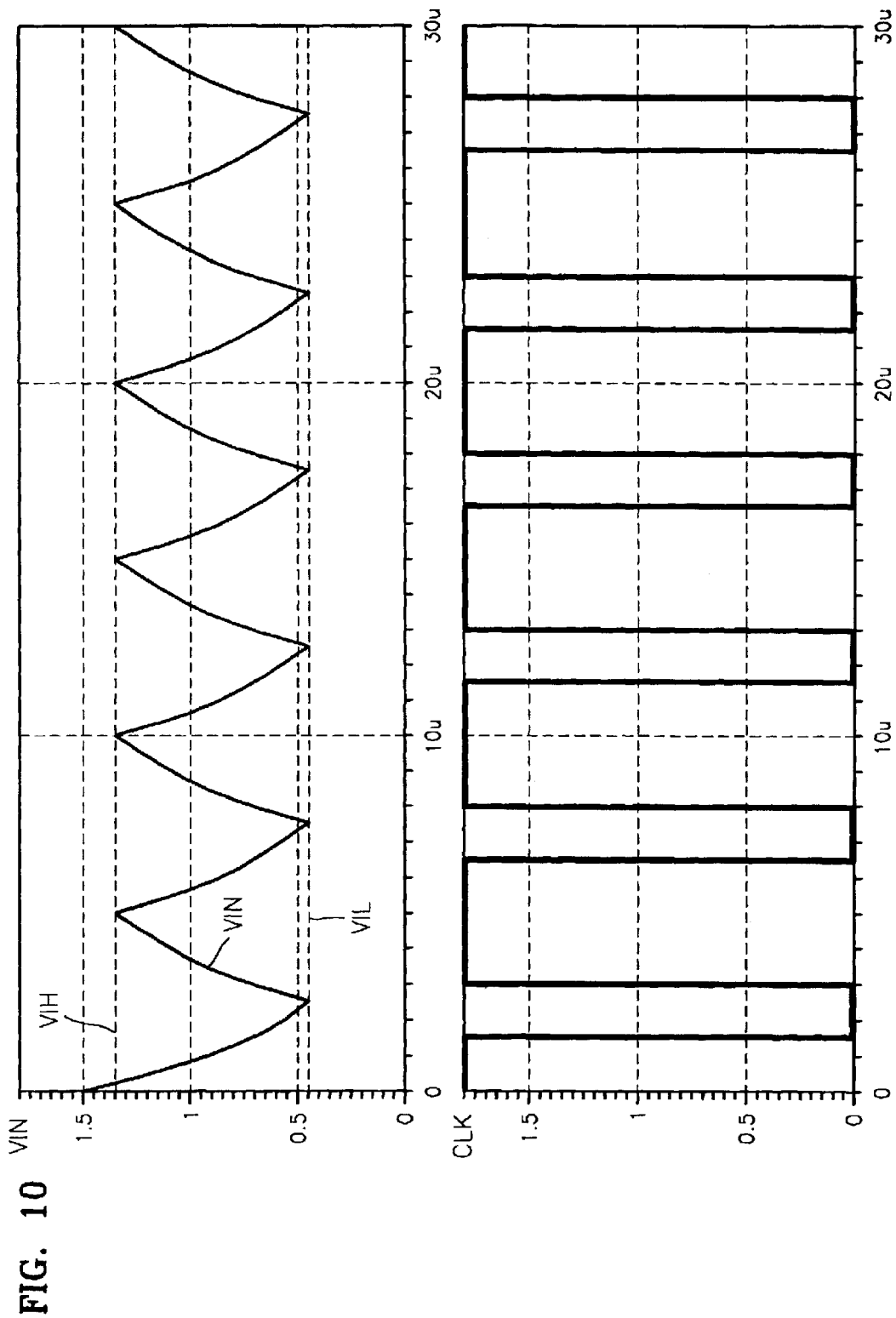
FIG. 10 is a diagram showing the waveforms of an input voltage and an oscillation signal, which are the results of performing a simulation on Simulation Program with Integrated Circuit Emphasis (SPICE) with respect to the RC oscillator shown in FIG. 6.
Figure 11:
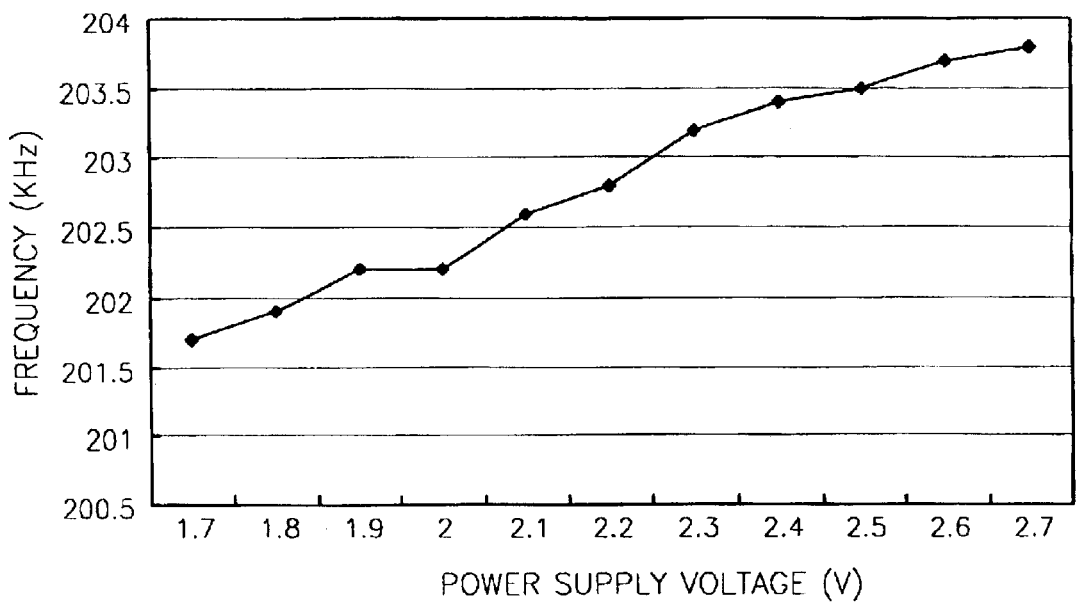
FIG. 11 is a graph showing the result of performing a simulation of the RC oscillator shown in FIG. 6 with respect to power supply voltage.
Figure 12:
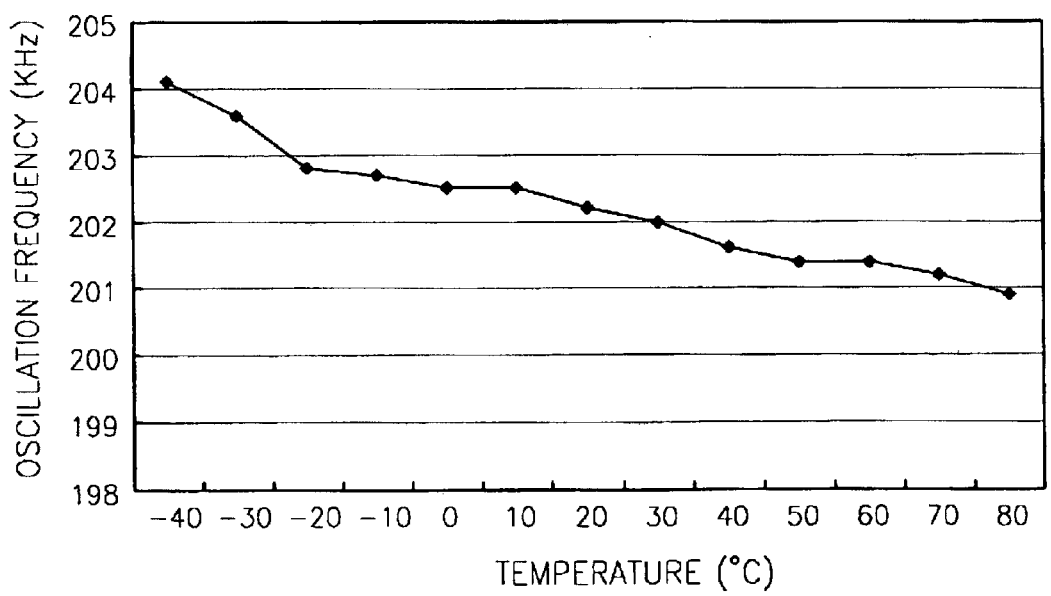
FIG. 12 is a graph showing the result of performing a simulation of the RC oscillator shown in FIG. 6 with respect to a temperature condition.

FIG. 10 is a diagram showing the waveforms of the input voltage VIN and the oscillation signal CLK, which are the results of performing a simulation on Simulation Program with Integrated Circuit Emphasis (SPICE) with respect to the RC oscillator shown in FIG. 6. FIGS. 11 and 12 are graphs showing the results of performing simulations with respect to the power supply voltage VDD and temperature condition, respectively, of the RC oscillator shown in FIG. 6.

It was found that a variation of the oscillation frequency fOSC with respect to the power supply voltage VDD was 1.2%/V, and a variation of the oscillation frequency fOSC with respect to the temperature was 0.013%/° C. As can be seen from the results of the simulations, the oscillator of the first embodiment of the present invention is substantially uninfluenced by external conditions such as temperature and power supply voltage.

Figure 13:
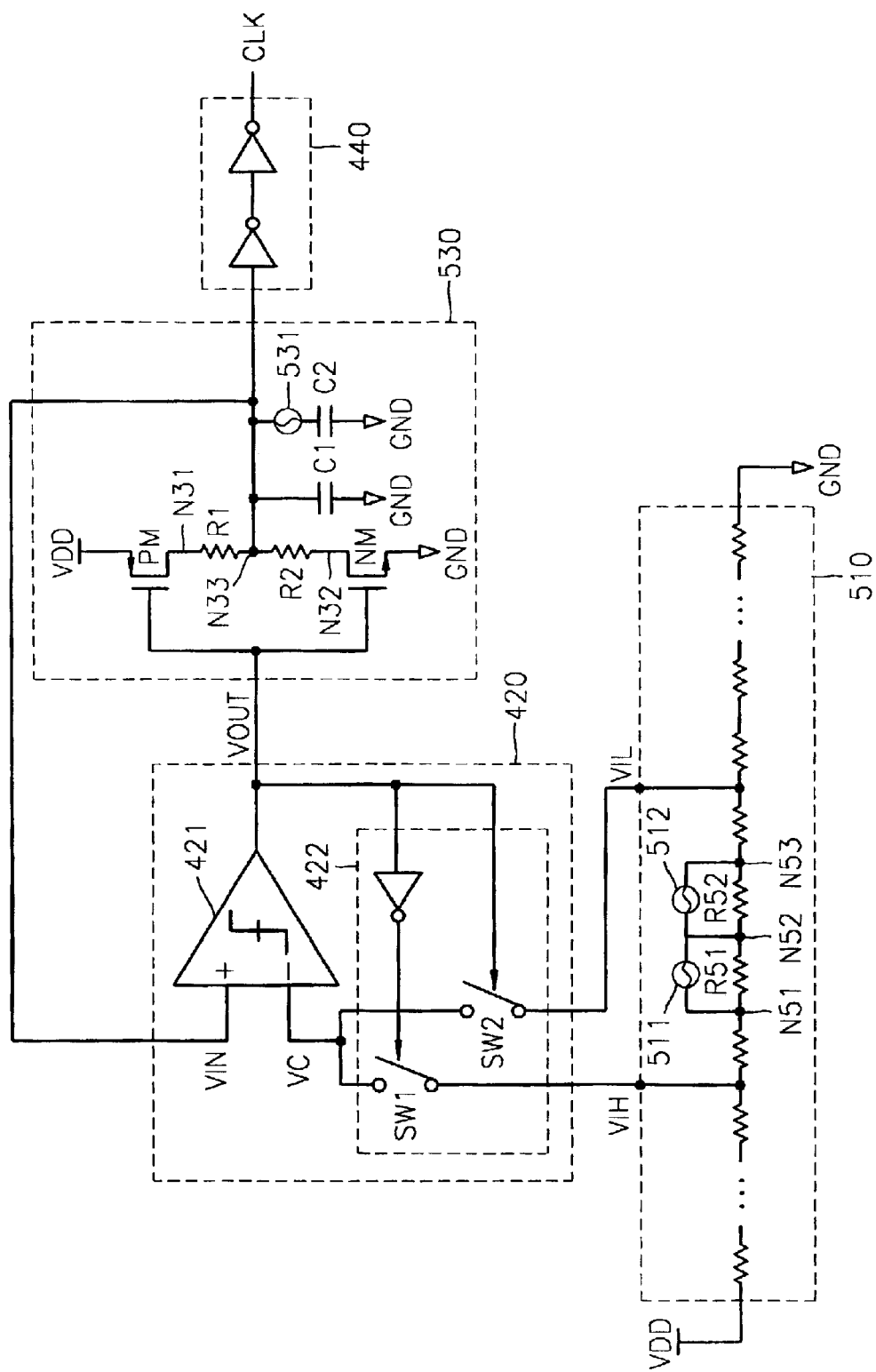
FIG. 13 is a circuit diagram of an oscillator according to a second embodiment of the present invention.

FIG. 13 is a circuit diagram of an oscillator according to a second embodiment of the present invention. Referring to FIG. 13, the oscillator of the second embodiment comprises a transition voltage generator circuit 510, a Schmitt trigger circuit 420, an RC delay circuit 530, and a quantizer 440.

Like the transition voltage generator circuit 410 shown in FIG. 6, the transition voltage generator circuit 510 divides the power supply voltage VDD to generate the high transition voltage VIH and the low transition voltage VIL. Unlike the transition voltage generator circuit 410, the transition voltage generator circuit 510 also comprises at least one fuse connected in parallel to at least one among the resistors connected in series between the power supply voltage VDD and the ground voltage GND.

In the second embodiment, a total of two fuses are provided: a first fuse 511 disposed between a first resistance node N51 and a second resistance node N52, and a second fuse 512 disposed between the second resistance node N52 and a third resistance node N53. The first and second fuses 511 and 512 may be cut during or after the manufacture of the oscillator.

In a state in which the first and second fuses 511 and 512 are not cut, current flows through the first and second fuses 511 and 512 without flowing through a resistor R51 between the first and second resistance nodes N51 and N52 and a resistor R52 between the second and third resistance nodes N52 and N53. If the first fuse 511 is cut, the current flows through the resistor R51 between the first and second resistance nodes N51 and N52 and the second fuse 512 between the second and third resistance nodes N52 and N53. Accordingly, the ratio Na/Nb of the high transition voltage VIH to the low transition voltage VIL when the first fuse 511 is cut is larger than the ratio Na/Nb of the high transition voltage VIH to the low transition voltage VIL when the first and second fuses 511 and 512 are not cut.

If both first and second fuses 511 and 512 are cut, the current flows through the resistor R51 between the first and second resistance nodes N51 and N52 and the resistor R52 between the second and third resistance nodes N52 and N53. Accordingly, the ratio Na/Nb of the high transition voltage VIH to the low transition voltage VIL when both first and second fuses 511 and 512 are cut is larger than the ratio Na/Nb of the high transition voltage VIH to the low transition voltage VIL when only the first fuse 511 is cut.

As is inferred from Formula (8), when the ratio Na/Nb of the high transition voltage VIH to the low transition voltage VIL increases, the oscillation frequency fOSC decreases.

Accordingly, after manufacturing the oscillator, the oscillation frequency fOSC can be controlled by cutting the first fuse 511 and/or the second fuse 512. Consequently, the exact desirable oscillation frequency fOSC can be obtained.

The Schmitt trigger circuit 420 and the quantizer 440 shown in FIG. 13 are the same as the Schmitt trigger circuit 420 and the quantizer 440 shown in FIG. 6, and thus a detailed description thereof will be omitted.

The RC delay circuit 530 is similar to the RC delay circuit 430 shown in FIG. 6 with the exception that the RC delay circuit 530 shown in FIG. 13 comprises a plurality of capacitors, which are connected in parallel between an output node N33 and the ground voltage GND, and at least one fuse, which is disposed between the capacitors and the output node N33.

In the second embodiment, two capacitors, i.e., first and second capacitors C1 and C2, are connected between the output node N33 and the ground voltage GND, and a single fuse 531 is disposed between the second capacitor C2 and the output node N33.

Like the first and second fuses 511 and 512 of the transition voltage generator circuit 510, the fuse 531 may be cut during or after the manufacture of the oscillator. If the fuse 531 is cut, capacitance Cd decreases compared to a case where the fuse 531 is not cut.

Accordingly, as is inferred from Formula (8), if the capacitance Cd decreases, the oscillation frequency fOSC increases. Therefore, the oscillation frequency fOSC can be controlled by selectively cutting the fuses 511 and 512 of the transition voltage generator circuit 510 and the fuse 531 of the RC delay circuit 530, so that an exact desirable oscillation frequency fOSC can be obtained.

In addition, first and second resistors R1 and R2 of the RC delay circuit 530 can be connected by a user, instead of being included in an integrated circuit, i.e., a chip. In other words, according to the second embodiment, the oscillator may be designed and manufactured by integrating circuit devices other than the first and second resistors R1 and R2 on a chip and forming external terminals so that the first and second resistors R1 and R2 can be externally connected to the chip through the external terminals by a user.

The user can connect first and second resistors R1 and R2 needed to obtain a desirable oscillation frequency fOSC, to the external terminals of the oscillator according to the second embodiment of the present invention. In this case, the oscillator is designed such that a particular oscillation frequency can be obtained with respect to particular values of the first and second resistors R1 and R2.

If an error occurs in the oscillation frequency fOSC after the manufacture, the oscillation frequency fOSC can be controlled by selectively cutting the fuses 511 and 512 of the transition voltage generator circuit 510 and the fuse 531 of the RC delay circuit 530, as described above, thereby obtaining the exact desirable oscillation frequency fOSC.

According to the present invention, even if a power supply voltage changes, an oscillation frequency can be kept constant by controlling a transition voltage input into a Schmitt trigger circuit to select a proper transition voltage. In addition, since an oscillator according to the present invention is composed of a physical resistance and capacitor, the oscillation frequency is rarely influenced by temperature. Accordingly, an oscillation signal having a stable oscillation frequency, which is independent of external conditions, such as power supply voltage and temperature, can be obtained. Moreover, according to the present invention, the oscillation frequency can be increased or decreased using a fuse during or after the manufacture of an oscillator, so the oscillator can be exactly tuned to a desirable oscillation frequency.

The present invention is not restricted to the above-described embodiments, and it will be apparent that various changes can be made by those skilled in the art without departing from the spirit of the invention. Therefore, the scope of the invention is defined not by the detailed description of the invention but by the appended claims.

What is claimed is:

1. An RC oscillator comprising:
    a transition voltage generator circuit for generating a high transition voltage and a low transition voltage, the high and low transition voltages being proportional to a power supply voltage;
    a Schmitt trigger circuit for generating an output voltage having a first level when an input voltage becomes greater than the high transition voltage and having a second level when the input voltage becomes less than the low transition voltage;
    an RC delay circuit having a resistance and comprising a capacitor, the RC delay circuit generating the input voltage in response to the output voltage; and
    a quantizer for quantizing the input voltage to output a square-wave oscillation signal.

2. The RC oscillator of claim 1, wherein the transition voltage generator circuit divides the power supply voltage, thereby generating the high transition voltage and the low transition voltage lower than the high transition voltage.

3. The RC oscillator of claim 2, wherein the transition voltage generator circuit comprises at least two resistance devices which are connected in series between the power supply voltage and a first ground voltage.

4. The RC oscillator of claim 1, wherein the Schmitt trigger circuit comprises:
    a voltage comparator for comparing the input voltage with a transition voltage to generate the output voltage; and
    a controller for providing one of the high and low transition voltages as the transition voltage in response to the output voltage.

5. The RC oscillator of claim 1, wherein the RC delay circuit comprises:
    a first resistor and a second resistor connected to an output node;
    a first transistor formed between the power supply voltage and the first resistor, wherein the first transistor is gated in response to the output voltage;
    a second transistor formed between the second resistance and a ground voltage, wherein the second transistor is gated in response to the output voltage; and
    a capacitor formed between the output node and a second ground voltage.

6. The RC oscillator of claim 5, wherein turn-on resistances of the first transistor and second transistor are lower than resistance values of the first resistor and the second resistor, respectively.

7. The RC oscillator of claim 5, wherein the first resistor and the second resistor have the same resistance value.

8. An RC oscillator comprising:
    a Schmitt trigger circuit for generating an output voltage having a first level when an input voltage becomes greater than a high transition voltage and having a second level when the input voltage becomes less than a low transition voltage;
    an RC delay circuit for generating the input voltage by charging or discharging at least one capacitor in response to the output voltage, wherein the capacitor is formed between a predetermined output node and a first ground voltage;

a quantizer for outputting an oscillation signal having a predetermined oscillation frequency in response to the input voltage, wherein the levels of the respective high and low transition voltages are proportional to a first power supply voltage; and a transition voltage generator circuit for dividing the first power supply voltage, thereby generating the high transition voltage and the low transition voltage lower than the high transition voltage.

9. The RC oscillator of claim 8, wherein the Schmitt trigger circuit comprises:

a voltage comparator for comparing the input voltage with a transition voltage to generate the output voltage; and a controller for providing one of the high and low transition voltages as the transition voltage in response to the output voltage.

10. The RC oscillator of claim 8, wherein the transition voltage generator circuit comprises a plurality of resistance devices which are connected in series between the first power supply voltage and a second ground voltage.

11. The RC oscillator of claim 10, wherein the transition voltage generator circuit further comprises a fuse, which is connected to at least one among the plurality of resistance devices in parallel.

12. The RC oscillator of claim 11, wherein the oscillation frequency is decreased by cutting the fuse.

13. The RC oscillator of claim 8, wherein the RC delay circuit comprises:

a first transistor, which is formed between a second power supply voltage and a predetermined first node and is gated in response to the output voltage;

a second transistor, which is formed between a predetermined second node and a third ground voltage and is gated in response to the output voltage;

a plurality of capacitors, which are formed between the output node and the first ground voltage;

a first external terminal for electrically connecting a predetermined first resistor between the first node and the output node; and a second external terminal for electrically connecting a predetermined second resistor between the second node and the output node.

14. The RC oscillator of claim 13, wherein the first and second resistances are externally connected by a user.

15. The RC oscillator of claim 14, wherein turn-on resistances of the first transistor and the second transistor are lower than resistance values of the first resistor and the second resistor, respectively.

16. The RC oscillator of claim 14, wherein the RC delay circuit further comprises at least one fuse formed between the output node and one side of at least one of the plurality of capacitors.

17. The RC oscillator of claim 16, wherein the oscillation frequency increases by cutting the fuse.

18. An RC oscillator comprising:

a Schmitt trigger circuit for generating an output voltage having a first level when an input voltage becomes greater than a high transition voltage and having a second level when the input voltage becomes less than a low transition voltage, the Schmitt trigger circuit comprising a voltage comparator for comparing the input voltage with a transition voltage to generate the output voltage and a controller for providing one of the high and low transition voltages as the transition voltage in response to the output voltage;

an RC delay circuit for generating the input voltage by charging or discharging at least one capacitor in response to the output voltage, wherein the capacitor is formed between a predetermined output node and a first ground voltage; and a quantizer for outputting an oscillation signal having a predetermined oscillation frequency in response to the input voltage, wherein the levels of the respective high and low transition voltages are proportional to a first power supply voltage.

* * * * *